United States Patent
Hatakeyama

[19]

[11] Patent Number: 5,923,713
[45] Date of Patent: Jul. 13, 1999

[54] VITERBI DECODER

[75] Inventor: Izumi Hatakeyama, Tokyo, Japan

[73] Assignee: Sony Corporation, Tokyo, Japan

[21] Appl. No.: 08/798,547

[22] Filed: Feb. 11, 1997

[30] Foreign Application Priority Data

Feb. 28, 1996 [JP] Japan .................................. 8-041354

[51] Int. Cl.⁶ .......................... H03D 1/00; H04L 27/06; G06F 11/10
[52] U.S. Cl. .......................................... 375/341; 371/43.7
[58] Field of Search .................................. 375/341, 262, 375/340; 371/43.6, 43.7, 43.4; 341/107

[56] References Cited

U.S. PATENT DOCUMENTS

| | | | |
|---|---|---|---|
| 4,905,317 | 2/1990 | Suzuki et al. | 371/43.7 |
| 4,979,175 | 12/1990 | Porter | 371/43.7 |
| 5,272,706 | 12/1993 | Park | 371/43.7 |
| 5,390,198 | 2/1995 | Higgins | 371/43.8 |
| 5,432,803 | 7/1995 | Liu et al. | 375/340 |
| 5,559,837 | 9/1996 | Blaker et al. | 375/341 |

*Primary Examiner*—Stephen Chin
*Assistant Examiner*—Betsy L. Deppe
*Attorney, Agent, or Firm*—Jay H. Maioli

[57] ABSTRACT

A Viterbi decoder for reducing the access times of the path metric memory, for lowering the power consumption, speeding up the Viterbi decoding. includes a branch metric operating unit 12, an adder, comparator, selector (ACS) operating unit 13a and 13b, a path metric memory 14a for the lower states, and a path metric memory 14b for the upper states. The ACS operating unit 13a performs the ACS operation about the even states on the branch metric from the branch metric operating unit 12 and the path metric at the previous time point. The ACS operating unit 13b performs the ACS operation about the odd states. These ACS operations are executed in a time-dividing manner. The path metrics from these ACS operating units 13a and 13b are written in the path metric memories 14a and 14b. The memory 14a or 14b stores as one storage unit the path metrics of the adjacent even and odd states.

4 Claims, 9 Drawing Sheets

| ADDRESS | 14a | |
|---|---|---|
| 00 | S00 | S01 |
| 01 | S02 | S03 |
| 02 | S04 | S05 |
| ... | | |
| 3E | S7C | S7D |
| 3F | S7E | S7F |

| ADDRESS | 14b | |
|---|---|---|
| 00 | S80 | S81 |
| 01 | S82 | S83 |
| 02 | S84 | S85 |
| ... | | |
| 3E | SFC | SFD |
| 3F | SFE | SFF |

FIG.6

VITERBI DECODER

BACKGROUND OF THE INVENTION

1. Field of the Industrial Application

The present invention relates to a Viterbi decoder which is used for performing the socalled most likelihood decoding operation for convolutional codes.

2. Description of the Related Art

The Viterbi decoder is used for the most likelihood decoding technique for the convolutional codes. The Viterbi decoder is operated to select as the most likely path the path at the closest distance to the input code series from the paths of the known code series and to derive the decoded data for the selected path. The Viterbi decoding operation offers a high capability of correcting errors randomly appearing in a speech channel and in particular offers a far greater coding gain in combination with a flexible decoding and demodulating system. For example, a satellite communications system, which is subject to the influence of interference waves and whose power is strictly restricted, uses the convolutional codes as error-correcting codes and thus employs the Viterbi decoder for decoding the data signal.

The Viterbi decoding algorithm will be briefly described below.

For example, consider that the generating polynomials are $G_0(D)=1+D^2$ and $G_1(D)=1+D+D^2$, the coding rate is R=½, and a constraint length is K=3. The arrangement of the decoder for generating such codes is illustrated in FIG. 1. In FIG. 1, the input data is sequentially delayed by delay elements 301 and 302, each of which may be composed of a flip-flop, for example. Then, the delayed data of the delay element 302 is added to the input data by an adder 303. The adder 303 operates to add the input data to the data fed by the delay element 302 to feed the added data as an output $G_0$. Adders 304 and 305 are provided for adding the input data to the data fed by the delay element 301 and 302 to feed the added data as an output $G_1$.

Assuming that the outputs of the delay elements 301 and 302 provided in the coder are $b_1$ and $b_2$ respectively, the coder may take as its state four states of (00), (01), (10), and (11). Each state constantly has just two transitive states to be given if an input is applied to the state.

More specifically, when an input is 0, if the current state is (00) or (10), the state is transited to (00) and if the current state is (01) or (11), the state is transited to the state (10). When an input is 1, if the current state is (00) or (10), the state is transited to the state (01) and if the current state is (01) or (11), the state is transited to the state (11).

These state transitions are illustrated in the Trellis diagram of FIG. 2. As shown, a branch of a solid line indicates the transition given when the input is 0, while a branch of a broken line indicates the transition given when the input is 1. The figure noted along each branch means the code ($G_0$, $G_1$) shown in FIG. 1, which are output when the transition takes place in the branch.

As is obvious from FIG. 2, at the time of the transition to each state, two paths always lead to the state. In the Viterbi decoding algorithm, the decoding operation is executed to continuously select the most likely path of two paths leading to the state until a given time length, detect as a surviving path the most likely path from the selected paths selected in each state, and decode the received codes on the surviving paths.

The Viterbi decoder for decoding the convolutional codes based on the Viterbi algorithm includes a branch metric calculator for calculating a metric between the transmission series and each branch, an ACS (Adder, Comparator, Selector) operating unit for selecting the surviving path and calculating a path metric of the selected path, a path metric storage unit for storing a value of a path metric of each state, a path memory for storing an output of the selected path, and a most likelihood determining unit for detecting an address of the most likelihood path metric and control a path memory based on the address.

The ACS operating unit is served to select the surviving path in each state according to the so-called path metric transition diagram and calculate the path metric of the surviving path. The path metric transition diagram is created on the Trellis diagram of FIG. 2.

The path metric transition diagrams shown in FIGS. 3A and 3B are created on the Trellis diagram of FIG. 2. For the Trellis diagram of FIG. 2, the paths that lead to the state (00) are a path appearing when a code (00) is generated in the state (00) and another path appearing when a code (11) is generated in the state (10). Hence, in a case that the state value (path metric) of the previous time point is S00 (old) or S10 (old) and the branch metric is BM00 or BM11, the path metric S00 (new) of the current state (00) is any one of:

$S00\ (new)a=S00\ (old)+BM00$ $S00\ (new)b=S10\ (old)+BM11$

That is, the selected path has a smaller one of these two path metrics S00 (new)a and S00 (new)b located on the calculating way. These path metrics are fed as a path metric S00 (new) of the current state (00).

The paths that lead to the state (01) are a path appearing when the code (11) is generated in the state (00) and another path appearing when the code (00) is generated in the state (10). Hence, the path metric S00 (new) in this state is any one of:

$S01\ (new)a=S00\ (old)+BM11$ $S01\ (new)b=S10\ (old)+BM00$

The paths that lead to the state (10) are a path appearing when the code (01) is generated in the state (01) and another path appearing when the code (10) is generated in the state (11). Hence, the path metric S10 (new) in this state is any one of:

$S10\ (new)a=S01\ (old)+BM01$ $S10\ (new)b=S11\ (old)+BM10$

The paths that lead to the state (11) are a path appearing when the code (10) is generated in the state (01) and another path appearing when the code (01) is generated in the state (11). Hence, the path metric S11 (new) in this state is any one of:

$S11\ (new)a=S01\ (old)+BM10$ $S11\ (new)b=S11\ (old)+BM01$

On these rules are created the path metric transition diagrams as shown in FIGS. 3A and 3B.

The conventional Viterbi decoder has been known where the ACS operation is executed in a time-divisional manner and the path metric memory for storing the path metric value obtained as a result of the ACS operation utilizes a RAM (Random Access Memory). This type of Viterbi decoder is served to allocate to one address of the RAM a path metric value that is used for the ACS operation at a next time point to the time when the ACS operational is done. This means that the path metric value of one state is stored in one address of one RAM.

In this operation, one ACS operation is executed to create a new path metric value from the path metrics of the previous two states. This means that it is necessary to make three accesses to the RAM for one ACS operation for the purpose of reading the previous two path metrics and writing one new path metric. The so-called dual port RAM may be used for separating the write and the read and doing them in parallel. However, even the arrangement with the dual port RAM needs two reading operations. Therefore, the conventional Viterbi decoder that performs the foregoing operation needs lots of memory accesses and thus a high-speed RAM and address generating circuit. These high-speed units are obstacles to saving the power consumption and speeding up the overall operation.

SUMMARY OF THE INVENTION

The present invention is made under the above-mentioned condition, and it is an object of the present invention to provide a Viterbi decoder which is arranged to reduce memory accesses in number, save the power consumption, and enhance the Viterbi decoding operation without having to speed up the memory access and the addressing operation though a relatively inexpensive, general-purpose memory such as a RAM is used for a path metric memory.

In carrying out the object, according to an aspect of the present invention, a Viterbi decoder is provided to execute the ACS operation in a time-divisional manner and divide a storage unit for a path metric into one portion for an upper state and the other portion for a lower state.

Preferably, the path metric storage unit for the upper state is arranged to store as one storage unit the path metrics of adjacent even and odd states for one address. So is the path metric storage unit for the lower state.

Each time four path metrics are operated by the ACS operation, preferably, the path metrics are read out of the path metric storage units for the lower state and the upper state just by one operation and the operated path metrics are correspondingly written in the path metric storage units for the lower state and the upper state.

BRIEF DESCRIPTION OF THE DRAWINGS

FIG. 6 is a view showing an internal arrangement of the path metric memory;

DESCRIPTION OF THE PREFERRED EMBODIMENTS

Hereafter, the description will be oriented to a Viterbi decoder according to an embodiment of the present invention with reference to the drawings.

Figure 1:
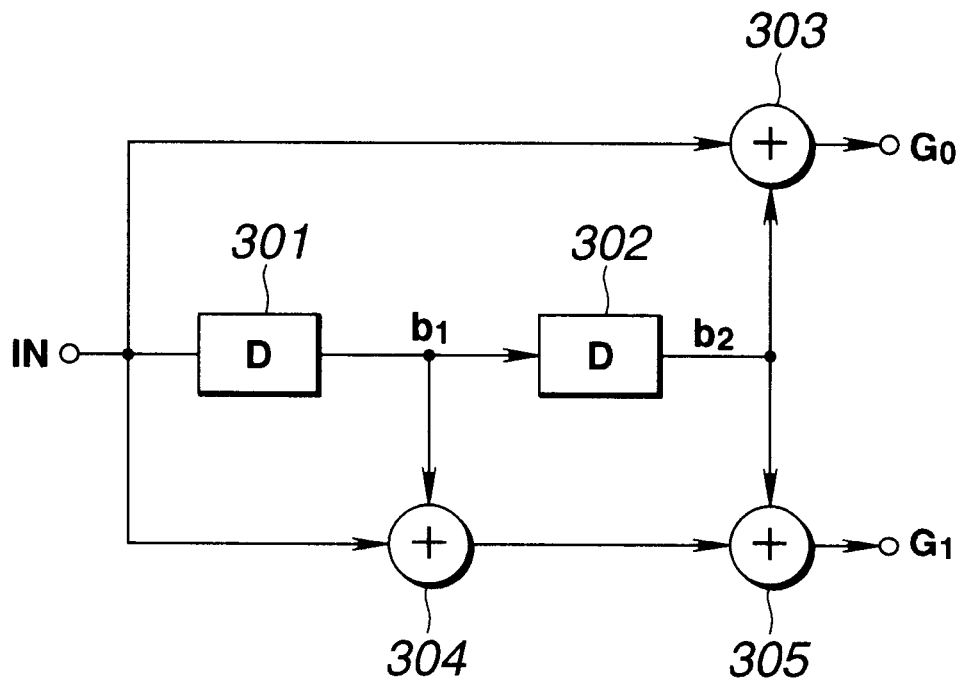
FIG. 1 is a block diagram showing a coder for convolutional codes.
Figure 2:
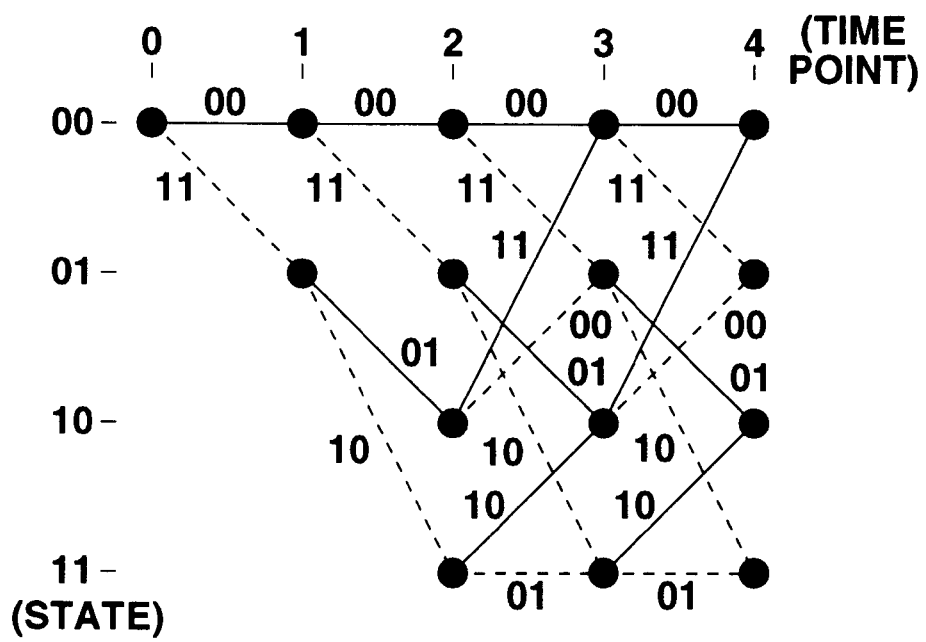
FIG. 2 is a Trellis diagram for describing the Viterbi decoding.
Figure 3A:
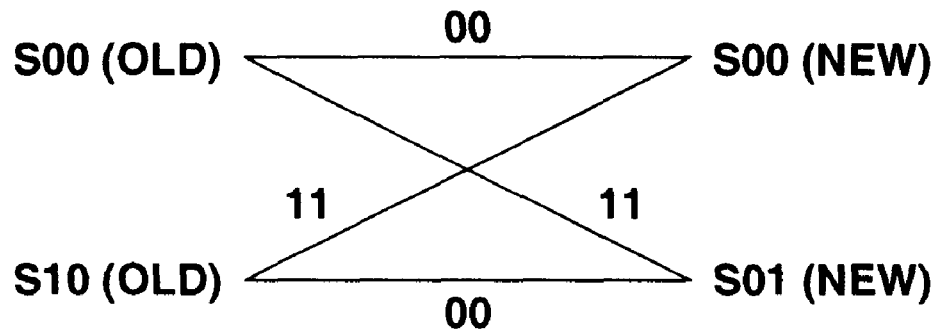
FIGS. 3A and 3B are views showing path metric transitions for describing the Viterbi decoding.
Figure 3B:
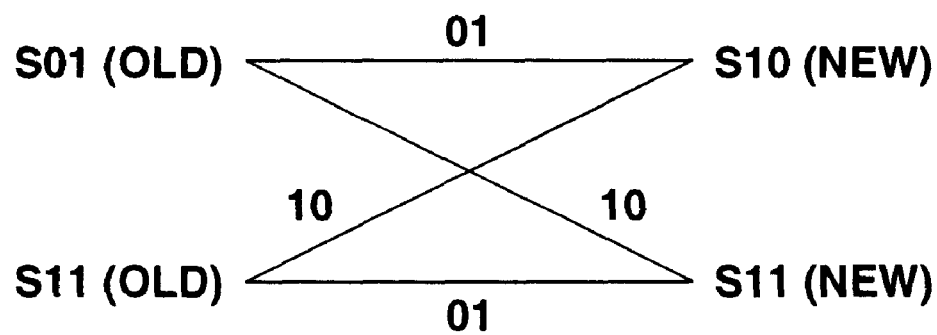
Figure 4:
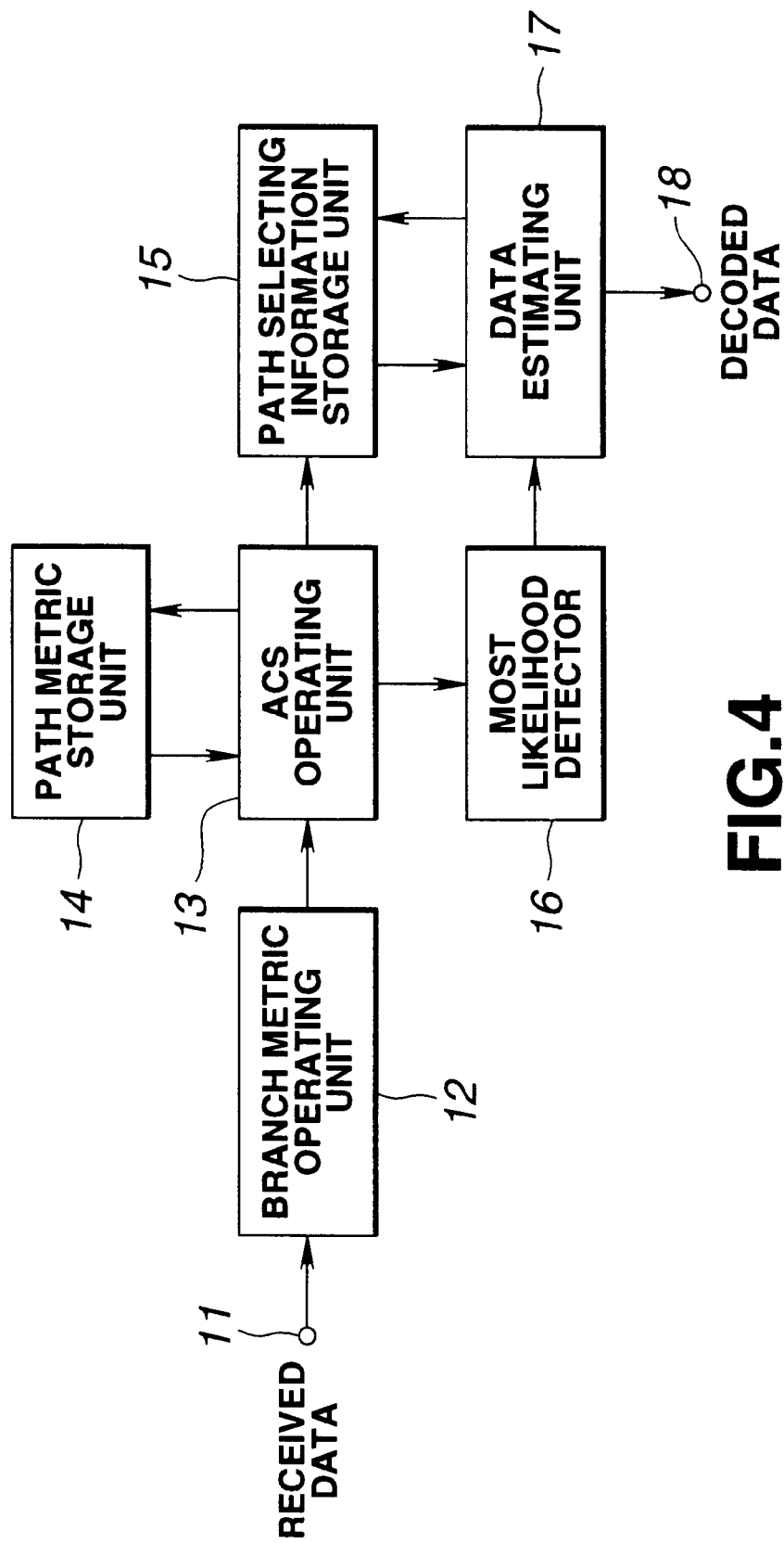
FIG. 4 is a block diagram showing a schematic arrangement of a Viterbi decoder according to an embodiment of the present invention.

FIG. 4 is a block diagram showing a schematic arrangement of the Viterbi decoder to which an embodiment of the present invention is applied.

In general, the Viterbi decoder is arranged to continuously select the most likely path of the two paths that lead to each state until a given length of time on the basis of the Viterbi algorithm and decode the received codes on the most likelihood path selected in each state.

The Viterbi decoder for calculating convolutional codes on this Viterbi algorithm is basically arranged to have a branch metric operating unit 12 for operating a metric between the code series of the data received at a terminal 11 and the foregoing each branch, an ACS (Adder, Comparator, Separator) operating unit 13 for calculating a path metric of each selected surviving path, a path metric storage unit 14 for storing a path metric in each state, a path selecting information storage unit 15 for storing an output of the path, which is the selecting information of the selected path, a most likelihood detector 16 for detecting a state having the most likelihood path metric value at each time point, and a data estimating unit 17 for estimating the data by using the state information and the previous path selecting information read from the path selecting information storage unit 15.

The concrete arrangement of the Viterbi decoding for the convolutional codes will be described with an example of a constraint length K=9 and a coding rate R=½. For the constraint length of K, the number of the prepared states is $2^{K-1}$. Hence, for K=9, the number of the prepared states is $2^8$=256. Each of these 256 states are represented as 00 to FF by a hexadecimal number composed of two digits. The path metric of the state xx is represented by Sxx. The path metric of the new state is Sxx (new) and the path metric of the state at the previous time point is represented as Sxx (old).

For the constraint length of K=9 and the coding rate of R=½, the ACS operation is executed to select the most likely path of the two paths that leads to each state. For example, the paths that are transited to a new state 00 (new) are one from the states 00 (old) and 80 (old) at the previous time point. In order to transit the states 00 (old) and 80 (old) to the state 00 (new), it is necessary to have the input codes as (00) and (11). Hence, the operation is executed to obtain the metric (branch metric) of each input code pattern from the input code (demodulated data) and combine it with the metric (path metric) at the previous time point, for the purpose of deriving the likelihood of the path, selecting the surviving path, and store and hold the metric of the selected path for the next time point.

Assuming that the branch metric is represented as BM ($G_0$, $G_1$) if the input code pattern is ($G_0$, $G_1$), that operation is as follows.

$S00$ (new)a=$S00$ (old)+$BM$ (00)

$S00$ (new)b=$S80$ (old)+$BM$ (11)

if (S00 (new)a<S00 (new)b) S00 (new)=S00 (new)a else

S0 (new)=S00 (new)b

This operation is executed for 256 states of S00 to SFF.

In this embodiment of the invention, the ACS operating unit 13 performs the ACS operation in a time-divisional manner. The path metric storage unit 14 uses a RAM which is divided into equal volumes for the upper and the lower states. Each volume of the RAM is arranged so that the path metrics of the adjacent even and odd states are stored as one storage unit for each address. In this arrangement, four path metrics are read out of two volumes at a rate of one for four ACS operations. The ACS operated result is written in the volumes of the RAM for the upper and the lower states at a rate of one for two ACS operations.

Figure 5:
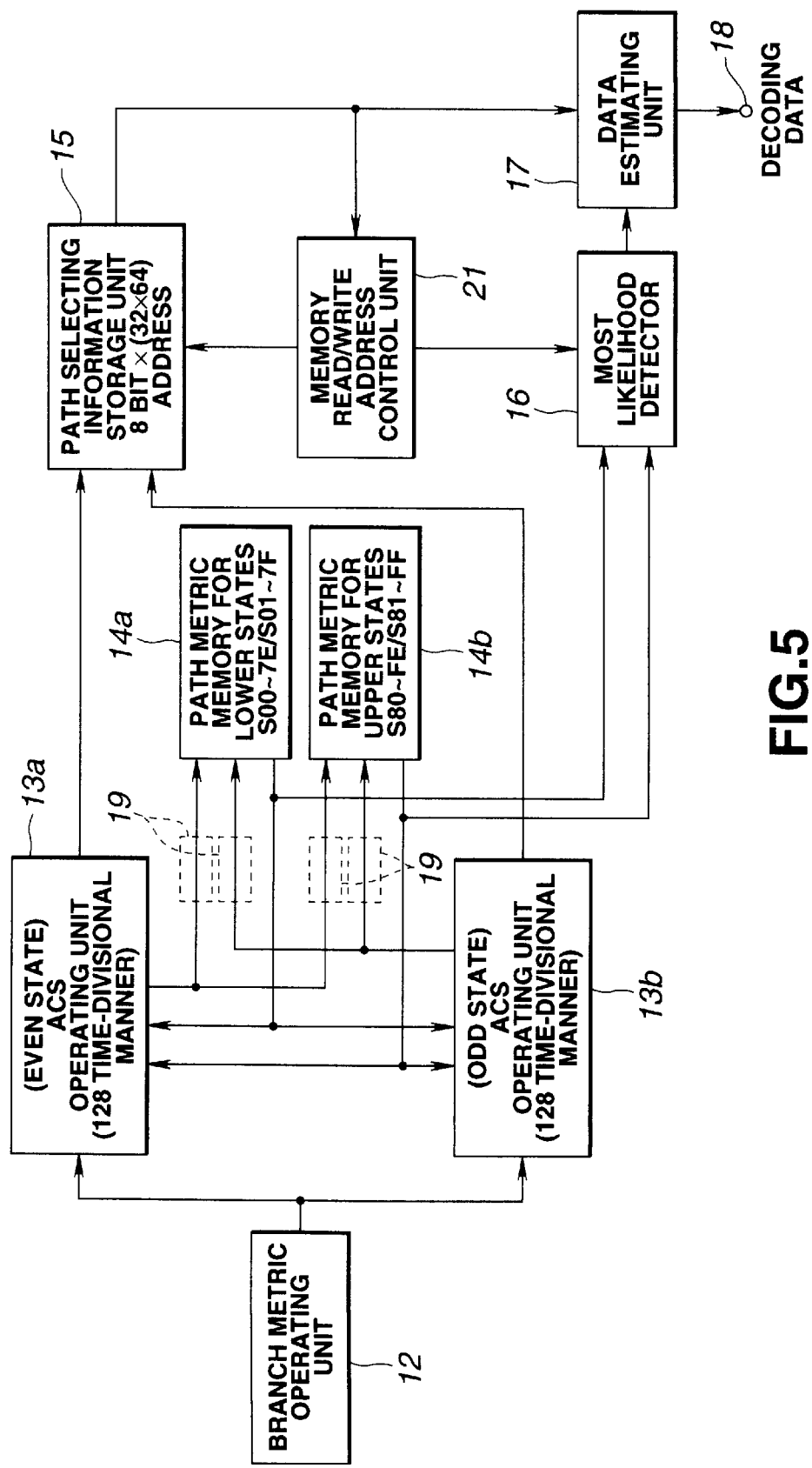
FIG. 5 is a block diagram showing a concrete arrangement around a path metric memory located in the Viterbi decoder shown in FIG. 4.

More specifically, as shown in FIG. 5, the two ACS operating circuits 13a and 13b are operated to do the ACS operations for 256 states in a 128 time-divisional manner. This ACS operation is executed to read the data from and write it to the path metric memory 14a for the lower states (00 to 7F) and the path metric memory 14b for the upper states (80 to FF).

More specifically, FIG. 5, each time the code ($G_0$, $G_1$) of the demodulated data is applied at a gives period T, the branch metric BM ($G_0$, $G_1$) created by the branch metric operating unit 12 is applied to each of the ACS operating circuits 13a and 13b. The ACS operating circuit 13a operates to calculate path metrics (S00, S02, ..., SFE) of the 128 even ones of the 256 states. The ACS operating circuit 13b operates to calculate path metrics (S11, S03, ..., SFF) of the remaining states, that is, the 128 odd ones. This ACS operation is executed in the 128 time-divisional manner, concretely, at a period of T/128. That is, the ACS operation is executed to sequentially read the path metrics of one previous time point (one previous T) 128 times, create the path selecting information for each process of the path metric, write it in the path selecting information storage unit 15, and write a new path metric to the path metric memories 14a and 14b.

The new path metric created at each process in the ACS operating circuits 13a and 13b which is written in the path metric memories 14a and 14b is sent to the most likelihood detector 16. When the ACS operations for all the states are terminated, the most likelihood state is detected on all the path metrics by the detector 16. Further, the ACS operation is executed to create an initial address value of the path selecting information storage unit 15 for selecting the previous path selecting information for estimating the data. A numeral 21 denotes a memory read/write address control unit 21, which receives the initial address value for creating the address of the path selecting information storage unit 15. In the remaining time except the write time (for example, three times for four processes), the path selecting information of one previous time point is read out of the path selecting information storage unit 15 and then is sent to the memory read/write address control unit 21. Again, the address of the path selecting information of one previous time point is created. The path selecting information storage unit 15 stores the path selecting information for 64 time points (64 T), for example. This path selecting information storage unit 15 operates to send the path selecting information to the data estimating unit 17. The data estimating unit 17 performs the data estimation on the basis of the previous path selecting information and the output from the most likelihood detector 16 and then outputs the decoded data at the terminal 18.

In FIG. 5, the path metric memories 14a and 14b for the lower and the upper states are arranged so that the path metrics of the adjacent even and odd states are stored as a storage unit for each address. That is, as shown in FIG. 6, the path metric memory 14a for the lower states stores as one storage unit the path metrics S00 and S01 of the states 00 and 01 at the address 00 (hexadecimal number composed of two digits) and the path metrics S02 and S03 of the states 02 and 03 at the address 01. This allocation is sequentially implemented for the subsequent states. At the last address 3F, the path metrics S7E and S7F of the states 7E and 7F are stored. The path metric memory 14b for the upper state stores as one storage unit the path metrics S80 and S81 of the states 80 and 81 at the address 00, stores the path metrics S82 and S83 of the states 82 and 83 at the address 01. This allocation is sequentially implemented for the subsequent states as well. At the last address 3F, the path metrics SFE and SFF of the states FE and FF are stored. In actuality, two pairs of the path metric memories 14a and 14b are used so that the metric is written in the memory of one pair while it is being read from the memory of the other pair and the read and write are alternately switched from one pair to the other pair.

The access for the path metric memories 14a and 14b will be described with reference to FIG. 7.

Figure 7:
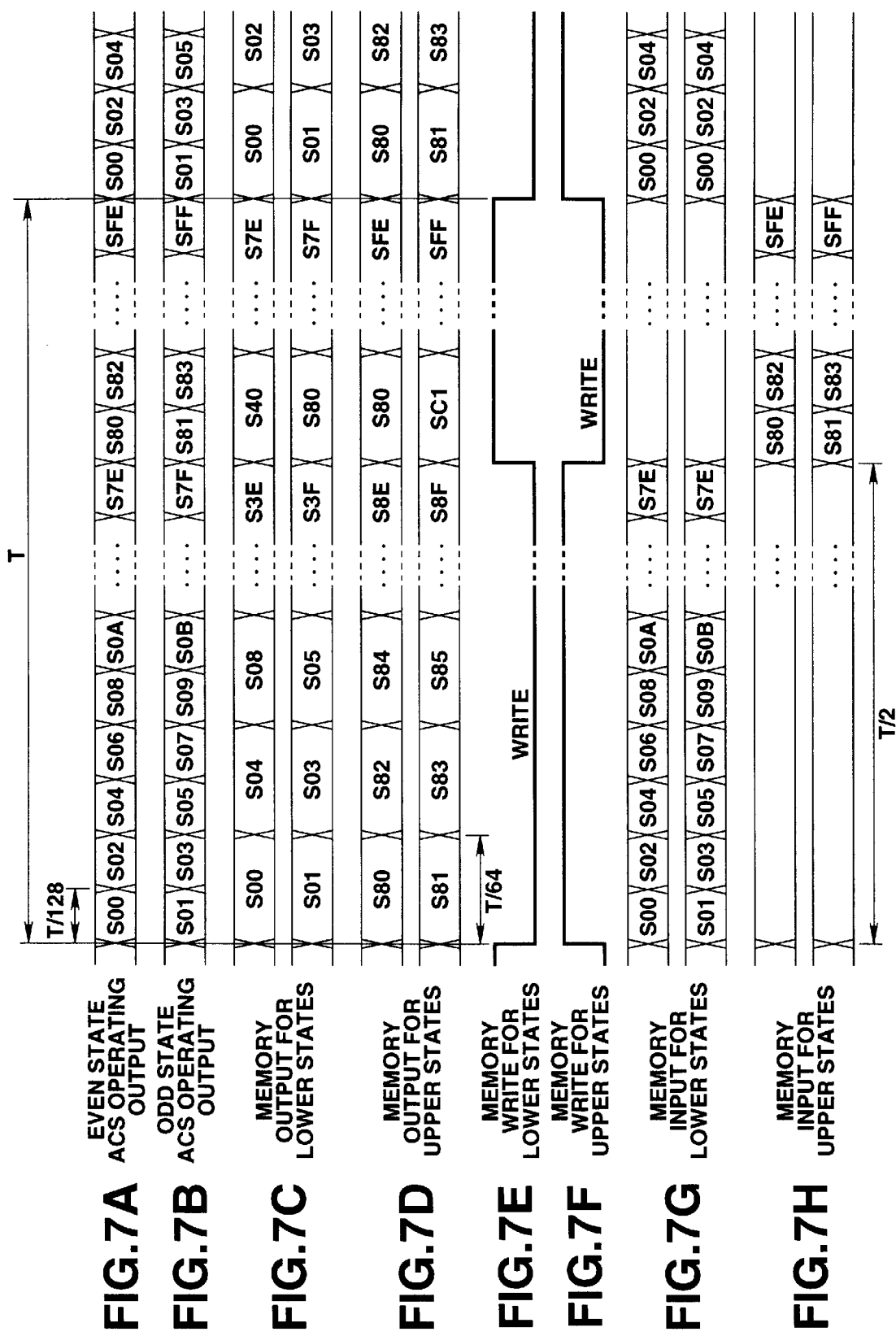
FIGS. 7A, 7B, 7C, 7D, 7E, 7F, 7G, and 7H are time charts for describing a concrete ACS operation and a concrete access of the path metric memory.
Figure 8:
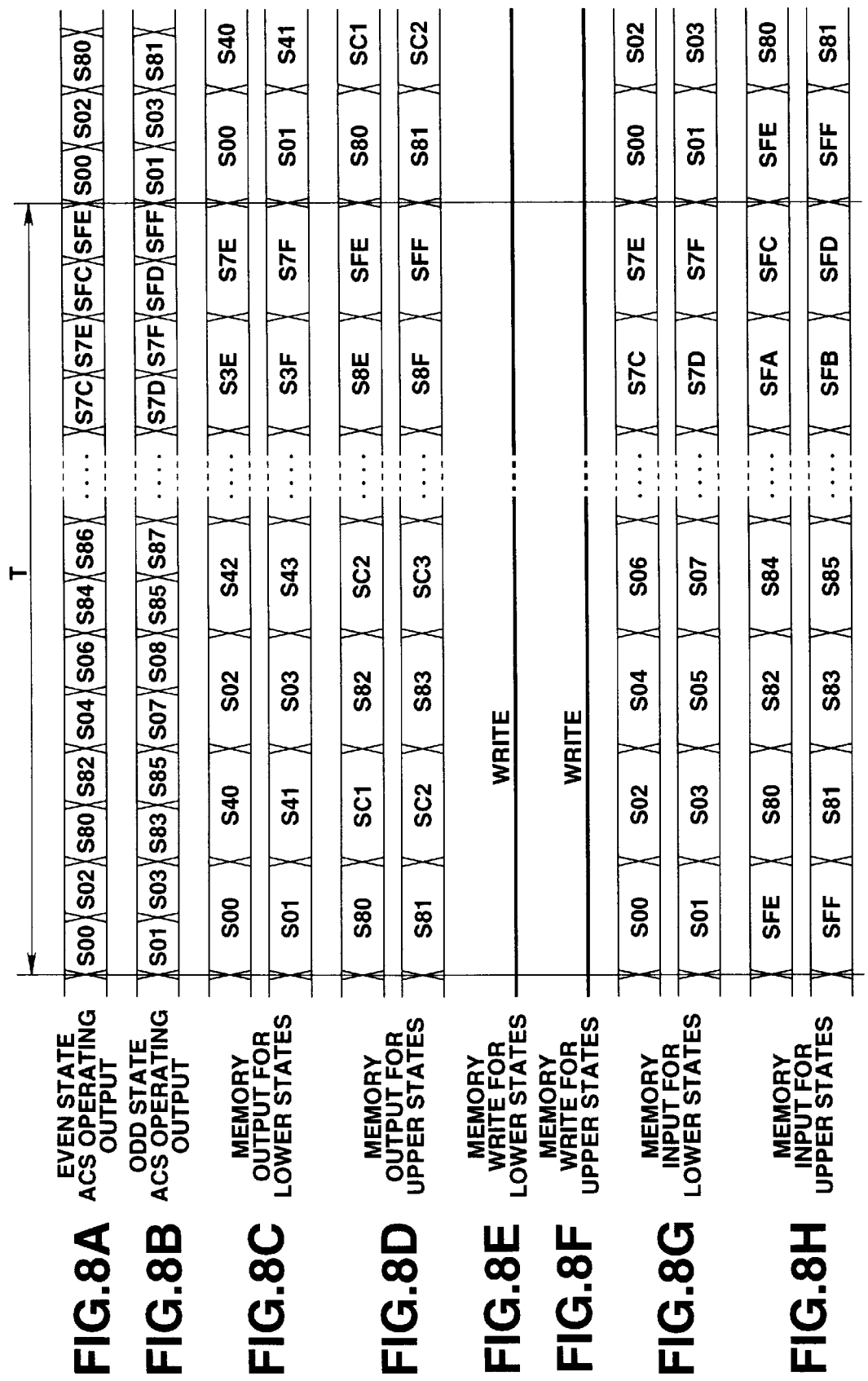
FIGS. 8A, 8B, 8C, 8D, 8E, 8F, 8G, and 8H are time charts for describing another concrete ACS operation and another concrete memory access of the path metric memory.

In FIG. 7, the period T of 256 states is the period of updating the decoded data. Each of the ACS operating circuits 13a and 13b performs the corresponding operation in the 128 time-divisional manner of the period T. That is, FIG. 7A shows the path metric output from the even state ACS operating unit 13a. FIG. 7B shows the path metric output from the odd state ACS operating unit 13b. These ACS operations are executed at each time slot derived by dividing the period T into 128 parts, for outputting the new path metric of each time slot.

In order to calculate the path metric S00 of the state 00, as stated above, the path metrics S00 and S80 at the previous time point are used. The path metric S01 is derived by selecting a smaller one of:

S01 (new)a=S80 (old)+BM (00)

S01 (new)b=S00 (old)+BM (11)

For deriving the path metric S01, therefore, the path metrics S00 and S80 at the previous time point are required. These path metrics S00 and S80 at the previous time points are read out of the path metric memories 14a and 14b for the upper and the lower states as shown in FIGS. 7C and 7D. The newly calculated path metrics S00 and S01 are written in the write memory part of the path metric memory 14a for the lower state as shown in FIG. 7G.

Next, the path metric S02 of the state 02 is derived by selecting a smaller one of:

S02 (new)a=S01 (old) and BM (01)

S02 (new)b=S81 (old) and BM (10)

The path metric S03 of the state 03 is derived by selecting a smaller one of:

S03 (new)a=S81 (old)+BM(01)

S03 (new)b=S01 (old)+BM(10)

Hence, the path metrics S01 and S81 at the previous time point are required. The path metrics S01 and S81 at the previous time points are read out of the path metric memories 14a and 14b for the upper and the lower states as shown in FIGS. 7C and D. The newly calculated path metrics S02 and S03 are written in the write part of the path metric memory 14a for the lower state.

The path metric memory 14a or 14b is composed of the storage areas for the path metrics of the adjacent even and odd states for one address. The path metrics S00 and S01 are read out of the readout storage area of the memory 14a at a time. The path metrics S80 and S81 are read out of the readout storage area of the memory 14b.

These reading operations are continuously executed during the process of the two ACS operations, that is, at a rate of once per two slots (T/64), one time slot corresponding to $\frac{1}{128}$ of the period T. The write storage area of the path metric memory 14a for the lower state enters into the writing state only during a first half (T/2) of the period as shown in FIG. 7E. Further, as shown in FIG. 7G, in this writing state, the two calculated path metrics are written in the write storage area 64 times, two for each time. Concretely, 128 path metrics ranging from S00 to S7F are written in the write storage area. The same ACS operation as that of this lower state holds true to the path metrics S80 to SFF of the upper state. The write storage area of the path metric memory 14b for the upper state is enabled to be writable only during a later half (T/2) of the period T as shown in FIG. 7F. As shown in FIG. 7H, in this writing state, the calculated 128 path metrics ranging from S80 to SFF are written in the write storage area in such a manner that two path metrics are written 64 times, two for each time.

As described above, the foregoing decoder is arranged to read the path metrics out of the path metric memories 14a and 14b 64 times, two for each time. The totally 256 (=64×2+64×2=256) memory accesses are executed for implementing the calculation of the path metrics of 256 states. On the other hand, the conventional ACS calculation needs two path metrics at the previous time point for deriving a path metric at the current time point. Hence, the necessary number of accesses to the path metric memories is 768 (256×2 for reading plus 256 for writing). The decoder of the foregoing embodiment reduces the access times to one third as compared with the conventional decoder. This leads to speeding up the operation, or even if the memory access speed is made lower, keeping the same or higher level than the conventional decoder. Further, lower memory access times also lead to lowering the power consumption.

In turn, the description will be oriented to a transformation of the foregoing embodiment with reference to FIGS. 8A to 8H, in which the sequence of the ACS operation is changed and the path metrics of the upper states and those of the lower states are alternately calculated.

As shown in FIGS. 8A to 8H, in the first two of the time slots derived by dividing the time T into 128 portions, like the cases of FIGS. 7A to 7H, the new path metrics S00, S01, S02, and S03 for the lower state are calculated on the path metrics S00, S01, S80, and S81 at the previous time point. In the subsequent two time slots, the new path metrics S80, S81, S82, and S83 for the upper state are calculated on the path metrics S40, S41, SC1, and SC2 at the previous time point. Likewise, in each pair of sequential time slots, the path metrics for the upper and the lower states are alternately derived. Each path metric derived by the calculation is written in the path metric memory for the lower or the upper state once for two slots (T/64). Hence, between the ACS operating circuit 13a and the path metric 14a and between the ACS operating circuit 13b and the path metric 14b is provided a latch 19 indicated by a broken line. The new path metrics S00, S01, S02, and S03 calculated in the first two slots are written in the path metric memory for the lower state in the first two time slots and the subsequent two time slots. The new path metrics S80, S81, S82, and S83 calculated in the new two time slots are written in the path metric memory for the upper state in those two time slots and the subsequent two time slots.

The transformation of the Viterbi decoder as shown in FIGS. 8A to 8H is required to read the data out of or write the data in the path metrics for the lower and the upper states just once for two time slots (T/64). This makes it possible to lower the memory access speed, which leads to the possible use of inexpensive memories. The other effects offered by this transformation are similar to the arrangement described with reference to FIG. 4. Hence, those effects are left off the specification.

In turn, the description will be oriented to an instrument to which the Viterbi decoder as described above applies with reference to FIGS. 9 and 10.

Figure 9:
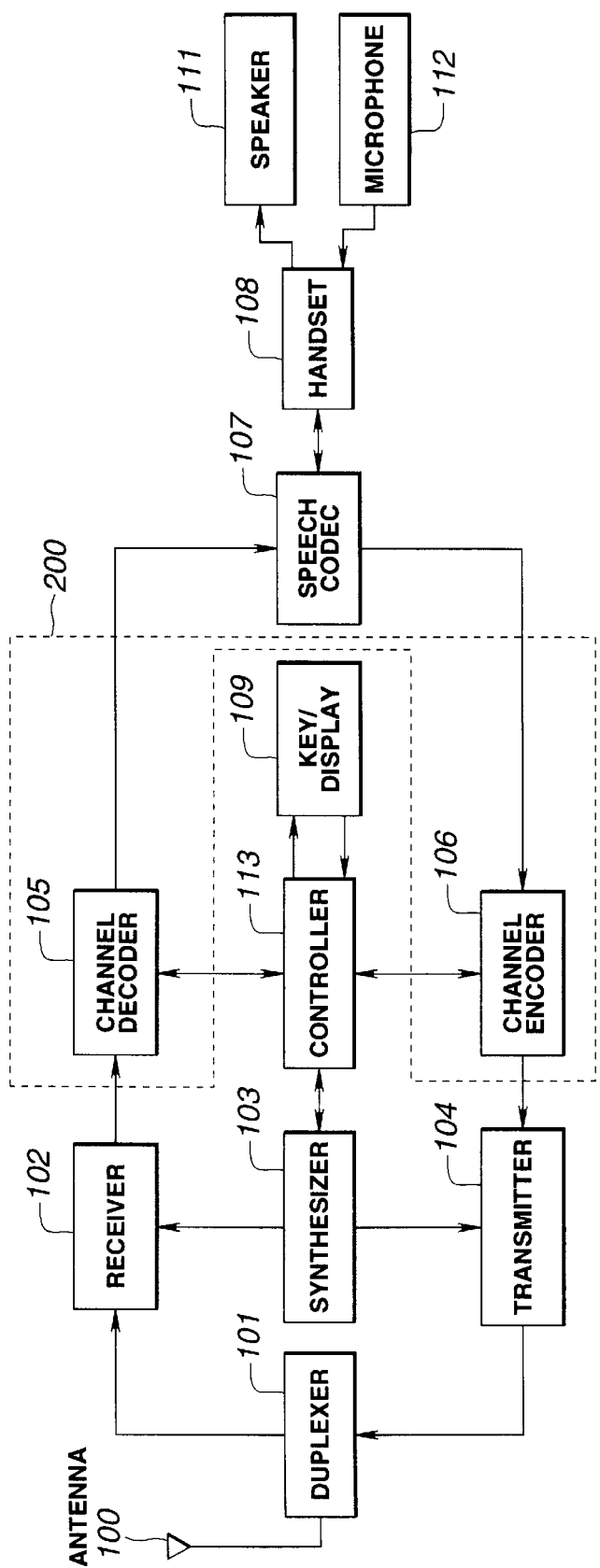
FIG. 9 is a block diagram showing a schematic arrangement of a digital mobile communication device.

FIG. 9 shows a schematic arrangement of a terminal of a digital mobile communications device which includes a channel codec for error-correcting the data using the foregoing Viterbi decoder.

The terminal of the digital mobile communications device shown in FIG. 9 includes as main components an antenna 100, a duplexer 101, a receiver 102, a transmitter 104, and a synthesizer 103. A carrier signal is received from the base station through the antenna 100. The carrier signal is transmitted to the receiver 102 through the duplexer 101. The receiver 102 operates to demodulate the signal. The signal to be transmitted is modulated by the transmitter 104 and then sent to the duplexer 101 for switching the received signal or the signal to be transmitted. Then, the carrier signal is sent through the antenna 100. The synthesizer 103 controls the receiving or transmitting frequency of the receiver 102 and the transmitter 104.

The output signal of the receiver 102 is sent to a channel decoder 105. This channel decoder 105 includes the Viterbi decoder 202 shown in FIG. 10, which converts the format or decodes speech and communications control information. The speech data from the channel decoder 105 is sent to a speech codec 107. The speech codec 107 operates to code or decode the speech signal and then feed the speech data to a channel encoder 106. The channel encoder 106 operates to convert the format or code the speech and communications control information. The channel decoder 105 and the channel encoder 106 compose the so-called channel codec 200.

The speech codec 107 is connected to a handset 108 through which the speech data is converted into the suitable format to a speaker 111 and a microphone 112. As a result, through the speaker 111 and the microphone 112, the speech communication is implemented.

Further, the controller 113 operates to create or decode the control information and set, reset, or keep a call. Further, the I/O control for a key/display 109 is executed by the controller 113. The synthesizer 103 for controlling the receiving and the transmitting frequencies is controlled by the controller 113.

Figure 10:
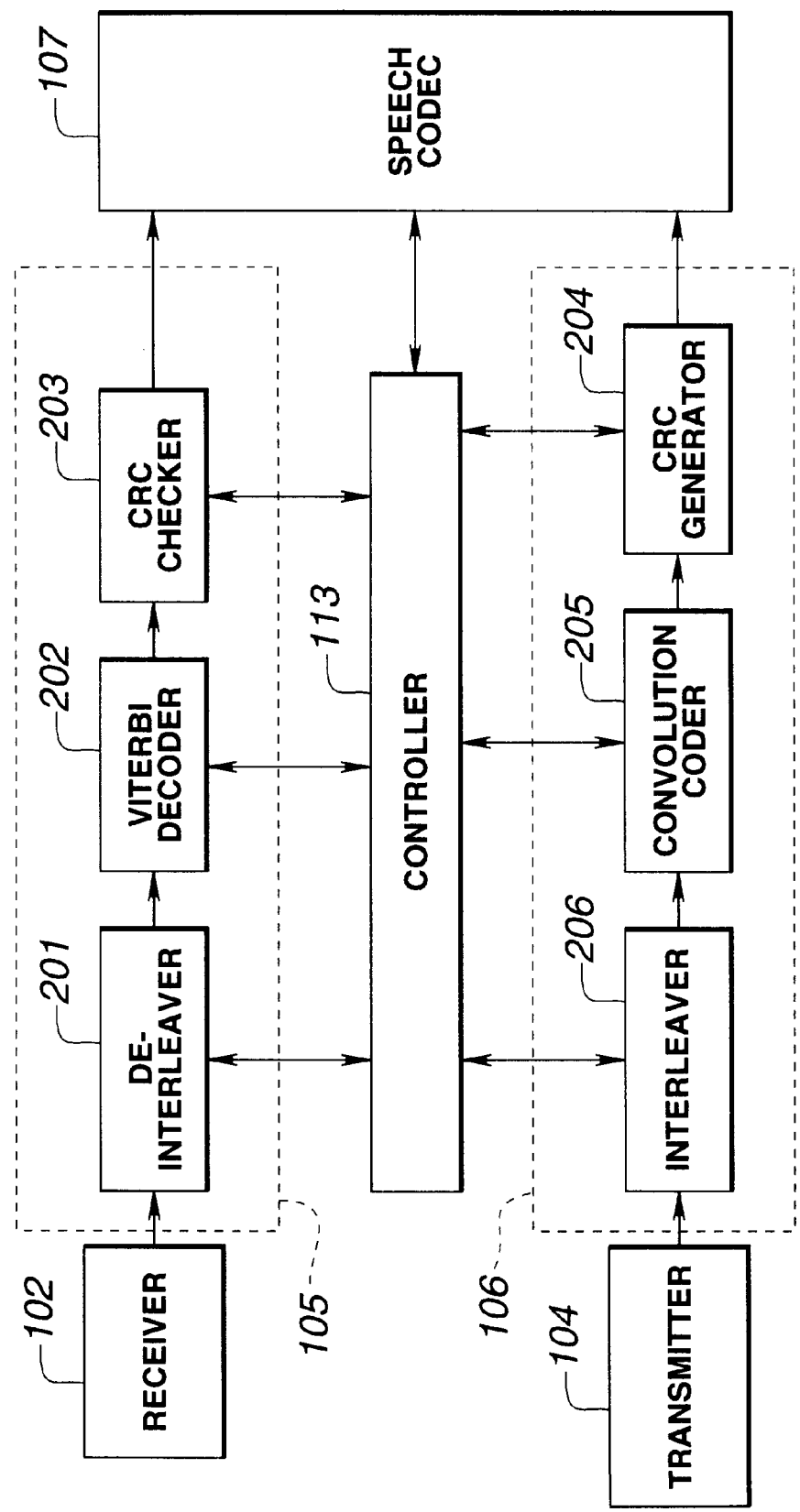
FIG. 10 is a block diagram showing a channel codec having the Viterbi decoder applied thereto and the arrangement around the Viterbi decoder located in the channel codec.

FIG. 10 is a block diagram showing the concrete arrangement of the channel codec 200 and its peripheral portion which includes a Viterbi decoder 202 according to the foregoing embodiment of the invention.

In FIG. 10, the speech data from the speech codec 107 and the control information from the controller 113 are sent to a CRC generator 204 located in the channel encoder 106. The CRC generator 204 is served to add CRCs to the data. Then, a convolutional coder 205 operates to error-correction-code the data and then an interleaver 206 performs the overall pre-processing before the modulation about the data, such as interleaving the data. Then, the pre-processed data is sent to a transmitter 104.

The received data fed from the receiver 102 is sent to a de-interleaver 201 located in the channel decoder 105. The de-interleaver 201 performs the de-interleaving operation about the received data. The resulting data is sent to the Viterbi decoder 202 arranged as described above, in which the data is error-corrected. The error-corrected data is sent to a CRC checker 203 in which the data is checked. The speech data from the CRC checker 203 is sent to the speech codec 107, while the control data from the CRC checker 203 is sent to the controller 113.

It goes without saying that the present invention is not limited to the foregoing embodiments. For example, in the multiplexing process, the number of the divided time slots may take any number. In order to correspond to the multiplexing process, it is just necessary to change the number of the path metrics stored per one address of the path metric memory. For example, unlike the two adjacent even and odd states in the arrangement as described above, the path metrics of four states may be stored in one address. Further, the constraint length of a code and a coding rate may be optionally set. Moreover, the Viterbi decoder according to the present invention may apply to various kinds of instruments arranged to use the Viterbi decoder in addition to the digital mobile communications device provided with the channel codec as described above.

According to the present invention, a Viterbi decoder is provided to execute the ACS operation in a time-divisional manner and divide a storage unit for a path metric into one portion for an upper state and the other portion for a lower state. Therefore, the number of the memory access necessary for a ACS operation can be reduced and the Viterbi decoding operation can be enhanced.

The path metric storage unit for the upper state is arranged to store as one storage unit the path metrics of adjacent even and odd states for one address. So is the path metric storage unit for the lower state. Therefore, each time four path metrics are operated by the ACS operation, the path metrics are read out of the path metric storage units for the lower state and the upper state just by one operation and the operated path metrics are correspondingly written in the path metric storage units for the lower state and the upper state. This results in reducing the number of memory access to one-third, thereby lowering the power consumption and keeping the Viterbi decoding speed high without speeding up the memory access.

What is claimed is:

1. A Viterbi decoder comprising:

means for calculating a branch metric for input codes fed thereto;

adder, comparator, selector operating means for calculating in a time-division manner a path metric for each state on the branch metric calculated by said means for calculating;

first storing means for storing the path metrics of lower states included in the path metrics calculated by said adder, comparator, selector operating means; and second storing means for storing the path metrics of upper states included in the path metrics calculated by said adder, comparator, selector operating means, wherein one read address for a memory read operation is supplied to read one of the path metrics of lower states stored in said first storing means and to read concurrently a complementary one of the path metrics of upper states stored in said second storing means.

2. A Viterbi decoder as claimed in claim 1, wherein each of said first storing means for storing the path metrics for the lower states and said second storing means for storing the path metrics for the upper states is arranged to store as one storage unit a pair of path metrics for a corresponding pair of adjacent even and odd states at each address therein.

3. A Viterbi decoder as claimed in claim 2, wherein each time four path metrics comprising two calculated pairs are calculated by said adder, comparator, selector operating means, two read pairs of path metrics are read out of said first storing means for storing the path metrics for the lower states and said second storing means for storing the path metrics for the upper states, respectively, in one memory operation, and the two calculated pairs of path metrics calculated by said adder, comparator, selector operating means are written in respective ones of said first and second storing means also in one operation.

4. A Viterbi decoder as claimed in claim 1, wherein said adder, comparator, selector operating means includes a first adder, comparator, selector operation circuit for calculating the path metric of the even state and a second adder, comparator, selector operation circuit for calculating the path metric of the odd state.

* * * * *